(12) United States Patent
Hummler

(10) Patent No.: US 7,373,583 B2
(45) Date of Patent: May 13, 2008

(54) ECC FLAG FOR TESTING ON-CHIP ERROR CORRECTION CIRCUIT

(75) Inventor: Klaus Hummler, Apex, NC (US)

(73) Assignee: Infineon Technologies North America Corp., San Jose, CA (US)

( * ) Notice: Subject to any disclaimer, the term of this patent is extended or adjusted under 35 U.S.C. 154(b) by 315 days.

(21) Appl. No.: 11/132,562

(22) Filed: May 19, 2005

(65) Prior Publication Data

US 2006/0282747 A1 Dec. 14, 2006

(51) Int. Cl.
*G11C 29/00* (2006.01)
(52) U.S. Cl. ...................................................... 714/763
(58) Field of Classification Search ................. 714/763
See application file for complete search history.

(56) References Cited

U.S. PATENT DOCUMENTS

| | | | |
|---|---|---|---|
| 6,543,029 | B1 | 4/2003 | Sandorfi |
| 6,754,858 | B2 | 6/2004 | Borkenhagen et al. |
| 6,792,567 | B2 | 9/2004 | Laurent |
| 6,851,081 | B2 | 2/2005 | Yamamoto |
| 2005/0044467 | A1* | 2/2005 | Leung et al. ................ 714/763 |
| 2006/0156192 | A1* | 7/2006 | Nakamura et al. .......... 714/763 |

OTHER PUBLICATIONS

University of New Brunswick, "Error Correction and the Hamming Code, EE4253 Digital Communications," pp. 1-4, (Apr. 2, 2002) <http://www.ee.unb.ca/tervo/ee4253/hamming.htm>.

* cited by examiner

*Primary Examiner*—James C. Kerveros
(74) *Attorney, Agent, or Firm*—Dicke, Billig & Czaja, PLLC

(57) ABSTRACT

The present invention includes an error correction circuit with a data memory, a control circuit, a parity memory, and a recorder. The data memory is configured to receive and store a set of data. The control circuit is configured to receive the set of data and to generate parity bits in response thereto. A parity memory is coupled to the control circuit and configured to receive and hold parity bits. The control circuit is further configured to combine the parity bits from the parity memory with the set of data from the data memory to determine whether an error occurred in the set of data. The recorder is coupled to the control circuit and configured to record an indication of whether an error occurred in the set of data.

25 Claims, 2 Drawing Sheets

| X | D7 | D3 | X | D6 | D5 | D4 | D2 | D1 | D0 | X | P0 | P2 | P3 | P1 |
|---|----|----|---|----|----|----|----|----|----|---|----|----|----|----|
| 15 | 14 | 13 | 12 | 11 | 10 | 9 | 7 | 6 | 5 | 3 | 8 | 4 | 2 | 1 |
| 1 | 1 | 1 |   | 1 | 1 | 1 | 1 | 1 | 1 | 1 |   |   |   | 1 |
| 1 | 1 | 1 | 1 | 1 | 1 | 1 | 1 | 1 |   |   |   |   | 1 |   |
| 1 | 1 | 1 | 1 | 1 | 1 |   | 1 |   | 1 |   |   | 1 |   |   |
| 1 | 1 |   |   |   |   |   |   |   |   | 1 | 1 |   |   |   |

ECC FLAG FOR TESTING ON-CHIP ERROR CORRECTION CIRCUIT

CROSS-REFERENCE TO RELATED APPLICATIONS

This Utility Patent Application is related to U.S. patent application Ser. No. 11/132,605 filed on even date herewith entitled, "OPTIMIZED TESTING OF ON-CHIP ERROR CORRECTION CIRCUIT," having commonly assigned to the same assignee as the present invention, and hereby incorporated by reference.

BACKGROUND

The present invention relates to an error correction circuit and method. In particular, a system and method are provided for an error correction circuit used in association with a dynamic random access memory (DRAM) system.

Memory systems, such as DRAM systems, have large memory arrays with large numbers of individual memory cells. During fabrication of the memory arrays, or in subsequent packaging of the memory, it is possible for single cell failures to be introduced in the memory. In some cases, introduction of such failures can result in the need to scrap the entire package afterwards.

Consequently, many memory systems utilize error correction circuits (ETC.) to compensate for single cell failures in memory arrays. ECC generate parity codes and utilize a parity memory to detect, and in some cases correct, errors or failures in memory cells. In some cases, such ECC are built directly onto a memory chip in order to achieve superior quality for a customer.

Typically, memory chips are tested after fabrication and assembly to determine whether they are operating properly. In cases where ECC are integrated into the memory chip, testing of these memory systems can become cumbersome. If the testing must also test whether the ECC has corrected errors or failures in memory cells, extra testing time and processing resources are sometimes needed.

For these and other reasons, there is a need for the present invention.

SUMMARY

One aspect of the present invention provides an error correction circuit including a data memory, a control circuit, a parity memory, and a recorder. The data memory is configured to receive and store a set of data. The control circuit is configured to receive the set of data and to generate parity bits in response thereto. A parity memory is coupled to the control circuit and configured to receive and hold parity bits. The control circuit is further configured to combine the parity bits from the parity memory with the set of data from the data memory to determine whether an error occurred in the set of data. The recorder is coupled to the control circuit and configured to record an indication of whether an error occurred in the set of data.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated, as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
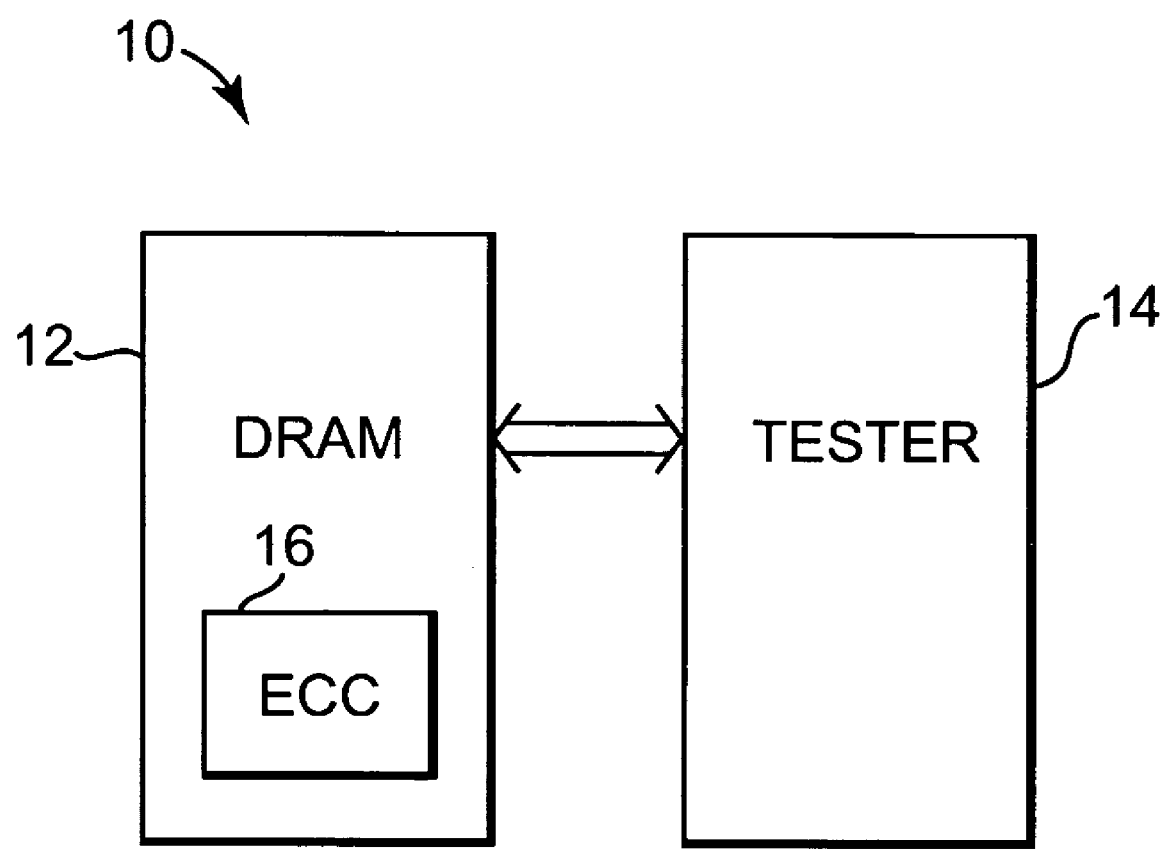
FIG. 1 illustrates a tester coupled to a memory chip with error correction circuitry.

FIG. 1 illustrates a block diagram of memory system 10 in accordance with one embodiment of the present invention. Memory system 10 includes memory chip 12, which is illustrated coupled to memory tester 14. Memory chip 12 includes error correction circuit (ECC) 16 built directly onto the memory chip 12. In one embodiment, memory chip 12 is a dynamic random access memory (DRAM) chip.

In operation, tester 14 is used to test operability of memory chip 12. Typically, during a test pass, data is written to and then read from the various memory arrays within memory chip 12. Tester 14 can then determine the operability of the memory chip 12 after the test pass to determine whether or not there were failures within memory chip 12.

In one embodiment, ECC 16 uses so-called Hamming codes to detect and correct errors internally to memory chip 12. During a write operation, DQ data from the DQ bus is received in memory chip 12 and stored in a main memory array. Control circuitry within ECC 16 also calculates parity bits from this DQ data using exclusive or ("XOR") logic functions. These parity bits are then stored within a separate parity memory array. Then, during a read operation, this stored parity data is combined with the corresponding main data read from the main memory array (again via XOR gates) to detect and correct errors in the main data before it is sent to the DQ bus.

ECC 16 presents challenges to tester 14. For example, the information stored in the parity memory array is not typically externally accessible via the DQ bus. Thus, tester 14 does not have direct access to the parity memory array in order to test its functionality. Also, if tester 14 must use additional test time in order to separately test the parity memory array, a memory chip that includes an integrated ECC will have a disadvantage relative to a memory chip that does not include an integrated ECC In this way, if ECC 16 has corrected errors in the main data, these corrections can be transparent to tester 14. Thus, when memory chip 12 passes a test run by tester 14, it would not be known whether chip 12 passed because of the intervention of ECC 16, or whether it passed without any intervention from ECC16.

Figures 2, 3:
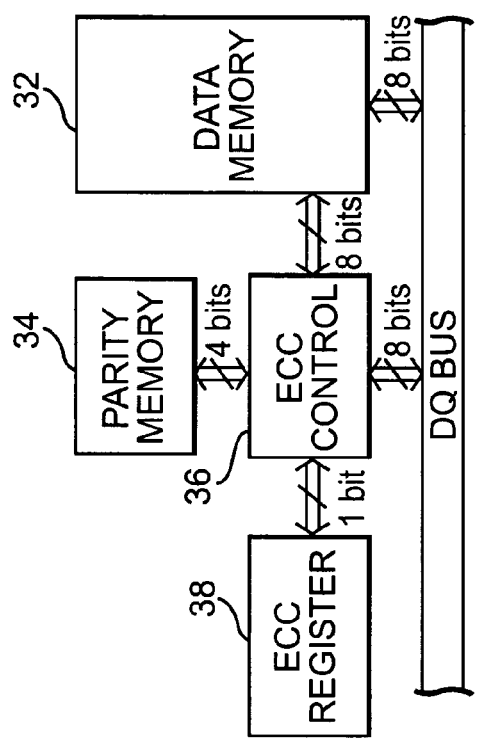
FIG. 2 illustrates a portion of data memory system including an error correction circuit in accordance with one embodiment of the present invention.
FIG. 3 is a table illustrating an error correction code used in a data memory system.

FIG. 2 illustrates a portion of a memory chip, such as memory chip 12 in FIG. 1, in accordance with one embodiment of the present invention. Memory chip 12 includes data memory 32, parity memory 34, ECC control circuit 36, and ECC register 38. Data memory 32 and ECC control circuit 36 are illustrated coupled to a DQ bus.

In operation, memory chip 12 may be tested, such as with tester 14 in FIG. 1. During a write operation, DQ data from the DQ bus is received in memory chip 12 and stored in memory array 32. ECC control circuitry 36 also received the DQ data and calculates parity bits from this DQ data. In one embodiment, the parity bits are calculated using XOR functions. These parity bits are then stored within parity memory array 34.

During a read operation, the parity data stored within parity memory array 34 is combined with the corresponding main data read from main memory array 32 in order to detect and correct errors in the main data before it is sent back onto the DQ bus. In one embodiment, the combination of the parity data and main data is also accomplished using XOR gates.

For most applications, the width of the DQ bus is driven by the application or user to be only as wide as needed for driving the main data. Thus, there will not typically be enough width to drive both the main data and any generated parity data at the same time on the DQ bus. For example, in an application where the DQ bus is eight bits wide, it will not be possible to drive both eight bits of data and four additional parity bits at once. In most applications, it would add unreasonable overhead to add width to the DQ bus in order to simultaneously drive main data and parity data.

In this way, as illustrated in the portion of memory chip 12 in FIG. 2, a tester does not have direct access to parity memory 34 in order to determine its operability during testing. In accordance with one embodiment of the invention, however, ECC register 38 is provided coupled to ECC control circuit 36 and is configured to collect ECC corrected and un-corrected results.

In this way, when a test is performed in one test pass, such that data is written and read via the DQ bus, ECC control circuit 36 generates parity bits as described. During this same test pass, ECC register 38 also monitors and records the occurrence of any correction events. In this way, ECC register 38 stores an ECC flag. This ECC register 38 is an on-chip register, which can then be read via a special test mode. In one embodiment, ECC register 38 is coupled to the DQ bus for reading during the special test mode.

In one embodiment, for each read operation performed, the ECC flag in ECC register 38 is checked. If an error is detected and corrected, the ECC flag in ECC register 38 is set to "fail". Each test item is performed on memory chip 12 as it would be for a non-ECC memory chip. At the end of each test (or wherever desired) the ECC flag can be read and ECC register 38 can be reset to "pass", such that it is ready for collection of the next test result.

In this way, with ECC register 38 each test item performed by a tester on the memory chip obtains three possible outcomes. In a first instance where no errors occur, the tester will indicate that data memory 32 is a "pass" and the ECC flag will also indicate a "pass". In a second instance where an error in data memory 32 does occur, but is successfully corrected by ECC control circuit 36, the tester will indicate that data memory 32 is a "pass" and the ECC flag will indicate a "fail". In a third instance where an error in data memory 32 does occur, and is not corrected by ECC control circuit 36, the tester will indicate that data memory 32 is a "fail" and the ECC flag will also indicate a "fail". It may be noted that there could be an instance where the ECC flag is "pass" and the tester indicates that data memory 32 is a "fail". In this case, the ECC control circuit 36 may be malfunctioning or the ECC control circuit 36 may have corrected so many errors that data could not adequately be corrected.

Consequently, a memory chip with an ECC including an ECC register integrated on the chip, can be tested in essentially the same way as a memory chip that does not have an on-chip ECC The results of the testing will not only determine whether there were internal memory fails, but also determine whether there were internal fails that were ECC-corrected. In this way, the test results allow the tester to balance between increasing yield and increasing quality of the tested chips.

For example, in one extreme case all die that pass external testing can be shipped, whether they have internal, ECC-correctable fails or not (increased yield, decreased quality). In another extreme, all die with any fails will be rejected and not shipped, whether they are ECC-correctable or not (decreased yield, increased quality). In other examples, a selection is made between the two extremes such that full flexibility is utilized to decide on a test-by-test basis, so that quality and cost can be tailored to individual customer's needs.

In an alternative embodiment, a variety of components can be used in place of ECC register 38. For example, in one embodiment ECC register 38 is replaced by a counter. In that case, the counter records the number of correction events for later read-out via a test mode. In yet other embodiments, more circuitry can be provided to log and output the entire result of the ECC control circuit. In this way, not only would it be known that ECC correction occurred, but the position where the fail occurred would also be recorded and collected in the special test mode.

With the ECC circuit of the present invention, full flexibility for quality trade-offs of devices with on-chip ECC is achieved, while still maintaining virtually the same test time as for a non-ECC device.

One example of an application in a test on a memory chip 12 is illustrated with reference to the Hamming code in FIG. 3. Essentially, the Hamming code is configured to detect and correct bit errors by inserting error correction or parity bits into a data stream, thereby increasing the overall number of bits. The parity bits can be examined after data is extracted to determine whether a bit error has occurred.

The Hamming code illustrated in FIG. 3, can be considered a modified (15,11) Hamming code or an (8,12) Hamming code. In this case, an 11-bit data stream has four parity bits inserted to bring the total number of bits to 15. However, since most data streams have 8 bits, 3 of the eleven are not used (indicated by the "X" in the columns), and thus, the code will be referred to as an (8,12) Hamming code.

The second row in the table of the (8,12) Hamming code lists the bit locations 1-15. As indicated, after insertion of the four parity bits, there are 15 total bit locations. The first row in the table lists the bit definitions. Data bits from an 8-bit data stream are indicated with D0, D1, D2, D3, D4, D5, D6, and D7. The three unused data bits are indicated with an "X". The four parity bits are indicated with P0, P1, P2, and P3. As may be apparent, the parity bits are located in each of the locations that are powers of 2, or at locations $2^n$, such that they will be in positions 1, 2, 4, and 8.

A general ECC algorithm within EEC control circuit 36 works according to this table in FIG. 3. Each parity bit calculates the parity for some of the bits in the code word. The position of the parity bit determines the sequence of bits that it alternatively checks and skips. For P1, the sequence of bits will be to check every other one bit location, that is, check one, skip one, check one skip one, etc. In the third row of the table, a "1" is placed under the data bit that is checked with parity bit P1. For P3, the sequence of bits will be to check every other two bit locations, that is, check two, skip two, check two skip two, etc. Again, in the fourth row of the table, a "1" is placed under the data bit that is checked with parity bit P3. For P4, the sequence of bits will be to check every other four bit locations, that is, check four, skip four, check four skip four, etc. Again, in the fifth row of the table, a "1" is placed under the data bit that is checked with parity bit P4. Finally, for P0, the sequence of bits will be to check every other eight bit locations, that is, check eight, skip eight, check eight skip eight, etc. In the fifth row of the table, a "1" is placed under the data bit that is checked with parity bit P0.

For a write operation, the parity bit is then set to 1 if the total number of ones in the sequence of positions is odd and will be set to 0 is the total number of ones in the sequence of positions is even. This may be accomplished by performing an XOR operation on the data bits in the sequence associated with each parity bit (excluding the parity bit from the XOR operation). The result of the XOR operation determines the value of the associated parity bit.

Then, for a read operation, a XOR operation of the data bits along with the associated parity bit determines whether there is bit failure. If the result of the XOR operation is zero, then there was no bit failure. Where the result is not zero, however, it indicates a failure or error in the bit position associated with the parity bit.

In one embodiment, when an error code of zero indicates no fail, the ECC flag in ECC register 38 is not set. When an error code different from zero occurs, however, this triggers the correction of one of the DQ data bits, and the ECC flag in ECC register 38 will be set to "fail" for later read-out. In another embodiment, the parity bit that indicates the bit position where a failure or error occurred is stored for later retrieval.

Although specific embodiments have been illustrated and described herein, it will be appreciated by those of ordinary skill in the art that a variety of alternate and/or equivalent implementations may be substituted for the specific embodiments shown and described without departing from the scope of the present invention. Thus, this application is intended to cover any adaptations or variations of the specific embodiments discussed herein. Therefore, it is intended that this invention be limited only by the claims and the equivalents thereof.

What is claimed is:

1. An error correction circuit comprising:
a data memory configured to receive and store a set of data;
a control circuit configured to receive the set of data and to generate parity bits in response thereto;
a parity memory coupled to the control circuit configured to receive and hold parity bits, wherein the control circuit is further configured to combine the parity bits from the parity memory with the set of data from the data memory to determine whether an error occurred in the set of data; and
a recorder coupled to the control circuit and configured to record either an indication of whether an error occurred in the set of data or whether no error occurred in the set of data.

2. The error correction circuit of claim 1, wherein the control circuit is further configured to correct any error that occurred in the set of data.

3. The error correction circuit of claim 2, wherein the recorder is a register configured to set a flag each time an error is corrected in the set of data.

4. The error correction circuit of claim 2, wherein the recorder is a counter configured to count up each time an error is corrected in the set of data.

5. The error correction circuit of claim 1, wherein the parity bits are generated according to a modified Hamming code.

6. The error correction circuit of claim 1, wherein the parity bits from the parity memory are combined with the set of data from the data memory according to a modified Hamming code.

7. A system tester comprising:
a testing mechanism;
a memory chip coupled to the testing mechanism, the memory chip further comprising:
a data memory array configured to hold data;
a control circuit configured to receive the data and to generate parity bits therefrom;
a parity memory configured to hold the parity bits;
the control circuit further configured to receive and combine the data from the data memory array and the parity bits from the parity memory to determine whether an error occurred in the data; and
a register coupled to the control circuit and configured to store an indication of whether a failure occurred within the data memory, the register accessible via a data bus on the data memory array.

8. The system tester of claim 7, wherein the testing mechanism is configured to make a test pass on the memory chip such that operability of the data memory array is tested during the test pass.

9. The system tester of claim 8, wherein the indication of whether a failure occurred within the data memory is stored in the register as a flag during the test pass of the memory chip.

10. The system tester of claim 9, wherein testing mechanism is configured to read the flag stored in the register during a special test mode.

11. The system tester of claim 10, wherein the testing mechanism is configured to determine whether any of the data read out of the data memory is corrected data.

12. A memory device comprising:
a data memory configured to store data;
means configured to receive the data for generating parity bits from the data;
a parity memory configured to receive and hold the parity bits;
means configured to receive the data and the parity bits for correcting any errors in the data from storing in the data memory; and
means for recording whether either any errors in the data from storing the data in the data memory were corrected or whether there were no such corrections.

13. The memory device of claim 12, further including a tester coupled to the data memory and configured to run a test on the data memory to determine whether it is operable.

14. The memory device of claim 13, wherein the means for recording whether any errors occurred in the data is a register that can be accessed by the tester to determine whether any errors occurred in the data from storing the data in the data memory.

15. An error detection system comprising:
    a tester circuit;
    a data memory configured to receive and to store a set of data;
    an error correction circuit configured to receive the set of data and to correct errors in the set of data from its storage in the data memory; and
    a register coupled to the error correction circuit, the register configured to track each time the error correction circuit corrects errors in the set of data, the register being accesible on a data bus of the memory.

16. The error detection system of claim 15, wherein the error correction circuit generates parity bits based on the received set of data and stores the parity bits in a parity memory.

17. The error detection system of claim 16, wherein the error correction circuit is configured to correct errors in the set of data by combining the parity bits and the data from the data memory.

18. The error detection system of claim 15, wherein the tester circuit is configured to test the data memory during a test pass, wherein the register configured to track each time the error correction circuit corrects errors in the set of data during the test pass, and wherein the tester circuit accesses the register during a special test mode.

19. A method for detecting a failure within a memory device, the method comprising:
    writing a set of data in a data memory;
    writing the set of data to an error correction circuit configured to receive the set of data;
    generating parity bits with the error correction circuit using the set of data;
    storing the parity bits in a parity memory;
    logically combining the set of data from the data memory and parity bits from the parity memory; and
    storing an indication of whether either a failure occurred within the set of data written into the data memory or whether no failure occurred whithin the set of data written into the data memory.

20. The method of claim 19, wherein the logically combining step further includes combining the set of data from the data memory and parity bits from the parity memory according to a modified Hamming code.

21. A method testing a memory chip with on-chip error correction circuit comprising:
    providing a memory chip;
    writing a set of data in a data memory of the memory chip;
    writing the set of data to an error correction circuit on the memory chip;
    generating parity bits with error correction circuit;
    logically combining the set of data from the data memory with the parity bits to determine whether an error occurred within the set of data written into the data memory;
    correcting errors that occurred within the set of data written into the data memory;
    storing the indication of whether any errors were corrected in a register; and
    accessing the register via a data bus of the memory chip.

22. The method of claim 21, further including logically combining the set of data from the data memory with the parity bits using a modified Hamming code.

23. A system tester comprising:
    a testing mechanism;
    a memory chip coupled to the testing mechanism, the memory chip further comprising:
        a data memory array configured to accept and hold data from the testing mechanism;
        an error correction circuit configured to receive the data and to generate parity bits therefrom; and
        a parity memory configured to hold the parity bits, testing system not having direct access to the parity memory;
        wherein the error correction circuit receives and combines the data from the data memory array and the parity bits from the parity memory to determine whether an error occurred in the data or whether no error occurred in the data, and stores an indication of whether a failure occurred within the data memory.

24. The system tester of claim 23, further including an error correction register configured to set a flag each time a failure occurred within the data memory.

25. An error correction circuit comprising:
    a data memory configured to receive and store a set of data;
    a control circuit configured to receive the set of data and to generate parity bits in response thereto;
    a parity memory coupled to the control circuit configured to receive and hold parity bits, wherein the control circuit is further configured to combine the parity bits from the parity memory with the set of data from the data memory to determine whether an error occurred in the set of data; and
    a recorder coupled to the control circuit and configured to alternatively record an indication of when no error occurred in the set of data and an indication of when an error did occur in the set of data and was corrected by the control circuit;
    wherein the recorder is accessible on a data bus.

* * * * *

UNITED STATES PATENT AND TRADEMARK OFFICE
CERTIFICATE OF CORRECTION

PATENT NO. : 7,373,583 B2 Page 1 of 1
APPLICATION NO. : 11/132562
DATED : May 13, 2008
INVENTOR(S) : Hummler It is certified that error appears in the above-identified patent and that said Letters Patent is hereby corrected as shown below:

Column 1, line 10, after "having" and insert --Docket Number 2005P50752US/I331.213.101,--.

Column 1, line 28, delete "(ETC.)" and insert in place thereof --(ECC)--.

Column 4, line 16, delete "ECC" and insert in place thereof --ECC.--.

Column 5, line 3, delete "EEC" and insert in place thereof --ECC--.

Column 5, line 9, delete 2$^{nd}$ occurrence of "check one" and insert in place thereof --check one,--.

Column 5, line 13, delete 2$^{nd}$ occurrence of "check two" and insert in place thereof --check two,--.

Column 5, line 17, delete 2$^{nd}$ occurrence of "check four" and insert in place thereof --check four,--.

Column 5, line 21, delete 2$^{nd}$ occurrence of "check eight" and insert in place thereof --check eight,--.

Column 7, line 14, delete "the memory" and insert in place thereof --the data memory--.

Signed and Sealed this

Thirteenth Day of July, 2010

David J. Kappos
*Director of the United States Patent and Trademark Office*